United States Patent [19]

Yokosawa et al.

[11] Patent Number: 4,875,010
[45] Date of Patent: Oct. 17, 1989

[54] CIRCUIT FOR DETECTING AC MAGNETIC FIELD DUE TO MAGNETIC RESONANCE WITH A VARIABLE RESISTANCE FOR NOISE SUPPRESSION

[75] Inventors: Koichi Yokosawa, Kokubunji; Etsuji Yamamoto, Akishima; Hideaki Nakane, Hachioji; Masao Yabusaki, Tokyo; Yukiko Ogura, Hachioji, all of Japan

[73] Assignee: Hitachi, Ltd., Tokyo, Japan

[21] Appl. No.: 174,424

[22] Filed: Mar. 28, 1988

[30] Foreign Application Priority Data

Mar. 28, 1987 [JP] Japan .................... 62-74887

[51] Int. Cl.⁴ .................. G01V 3/00; G01R 33/02
[52] U.S. Cl. ..................... 324/248; 324/318
[58] Field of Search ............. 324/248, 309, 318, 225; 361/19, 141; 307/306

[56] References Cited

U.S. PATENT DOCUMENTS

| | | | |
|---|---|---|---|
| 3,667,033 | 5/1972 | Davis | 324/248 |
| 3,829,768 | 8/1974 | Nicol et al. | 324/248 |
| 4,390,840 | 6/1983 | Ganssen et al. | 324/309 |
| 4,707,661 | 11/1987 | Hoenninger, III et al. | 324/309 |
| 4,733,182 | 3/1988 | Clarke et al. | 307/306 |

Primary Examiner—Reinhard J. Eisenzopf
Assistant Examiner—Walter E. Snow
Attorney, Agent, or Firm—Antonelli, Terry & Wands

[57] ABSTRACT

In a signal detecting circuit of, for example, an NMR apparatus, a signal transmission path transmits an AC magnetic flux signal to be superposed on a DC magnetic field whose strength does not change with time during a period of signal detection. The signal transmission path comprises a superconducting closed loop including a receiving coil receiving the AC magnetic flux signal, an input coil applying the received AC magnetic flux signal as an input to a flux meter, and a variable resistor replacing part of the superconducting closed loop and having its resistance value changed in relation to a change in the strength of the DC magnetic field.

18 Claims, 3 Drawing Sheets

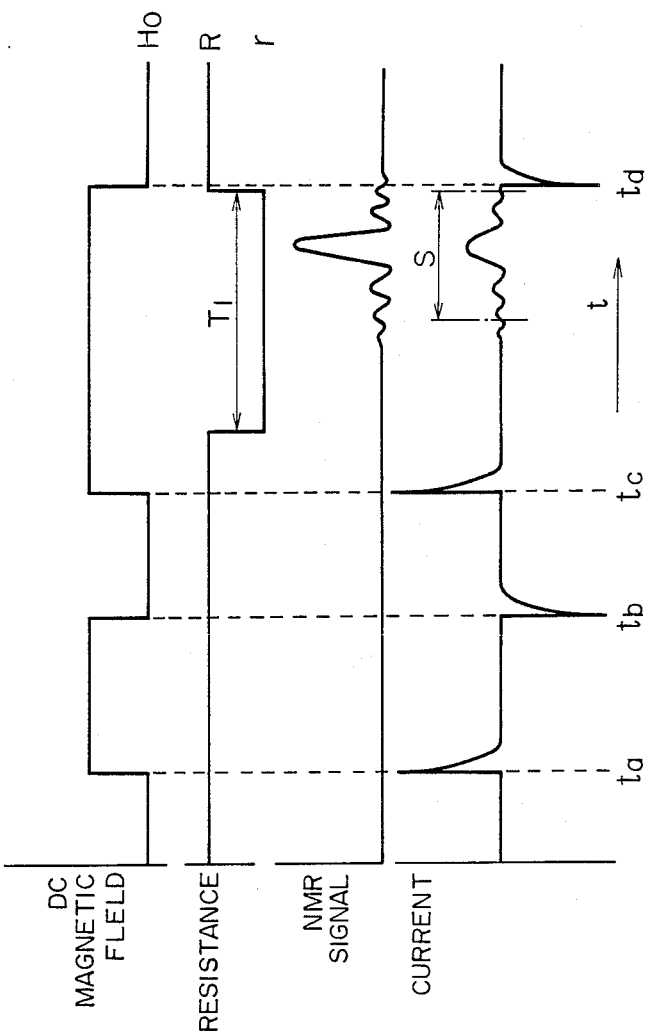

CIRCUIT FOR DETECTING AC MAGNETIC FIELD DUE TO MAGNETIC RESONANCE WITH A VARIABLE RESISTANCE FOR NOISE SUPPRESSION

BACKGROUND OF THE INVENTION

This invention relates to a magnetic flux detecting circuit which is suitable for measuring a relatively very weak magnetic flux in an environment where a large change occurs in a strong magnetic field. More particularly, this invention relates to a magnetic flux detecting circuit which is applicable to detection of, for example, a nuclear magnetic resonance signal (abbreviated hereinafter as an NMR signal) by a SQUID type flux meter.

A known SQUID type flux meter based on a known principle is provided with a magnetic flux signal transmission path utilizing superconduction as a means for transmitting and detecting magnetic flux to be measured by the flux meter. Such a magnetic flux detecting circuit is disclosed in, for example, JP-A-60-143752.

An NMR apparatus using a SQUID type flux meter is discussed in Applied Physics Letter Vol. 47(6), 1985, pp. 637–639. In this NMR apparatus, an electromagnetic wave is directed toward an object placed in a static magnetic field so as to cause generation of NMR in the object in a manner well known in the art, and the resultant NMR signal generated from the object is received by a high-selectivity LC resonance circuit composed of a receiving coil and a resonant capacitor immersed in a pool of liquid helium and is then detected by the SQUID type flux meter.

In the NMR apparatus using the SQUID type flux meter, a fixed resistance attributable to the loss in the capacitor is inevitably present in the resonance circuit, resulting in generation of thermal noise. Thus, the prior art NMR apparatus has had the problem that the S/N ratio is limited by the thermal noise attributable to the fixed resistance. This problem may be obviated by an arrangement in which, without the use of the resonance circuit, the NMR signal is directly applied to the SQUID type flux meter through a magnetic flux signal transmission path including a superconducting element. However, this arrangement has given rise to degradation of the accuracy of magnetic flux detection, because a shield current corresponding to the strong static magnetic field applied to the NMR apparatus flows in the magnetic flux signal transmission path.

Further, in the case of an NMR imaging apparatus, a gradient magnetic field is superposed on a static magnetic field prior to detection of an NMR signal, and the resultant induced current acts as an additional cause of degradation of the accuracy of magnetic flux detection. Both the strength of the static magnetic field and that of the gradient magnetic field do not change with time during the period of detection of the NMR signal. Therefore, in the following description, the sum of the static magnetic field and the gradient magnetic field will be referred to as a DC magnetic field. The strength of this DC magnetic field does not change with time during the period of detection of the NMR signal but changes in a rectangular fashion before and after that period.

SUMMARY OF THE INVENTION

In view of the circumstances described above, it is an object of the present invention to solve the aforementioned problems of the prior art magnetic flux detecting circuit and to provide a novel and improved magnetic flux detecting circuit which can transmit and detect a very weak magnetic flux even in an environment where a large change occurs in a strong magnetic field.

In accordance with one aspect of the present invention which attains the above object, there is provided a magnetic flux detecting circuit comprising means for establishing a DC magnetic field whose strength does not change with time during a period of signal detection, means for superposing an AC magnetic flux signal on the DC magnetic field, and means for transmitting the AC magnetic flux signal to a flux meter, the signal transmitting means comprising a superconducting closed loop including a receiving coil receiving the AC magnetic flux signal, an input coil applying the received AC magnetic flux signal as an input to the flux meter, and a variable resistor replacing part of the superconducting closed loop, the variable resistor having its resistance value changed in relation to a change in the strength of the DC magnetic field.

For example, in the NMR imaging apparatus described above, application of a gradient magnetic field and detection of a very weak AC magnetic flux are repeated. When the magnetic flux detecting circuit of the present invention is incorporated in such an NMR imaging apparatus, the function of the variable resistor is such that, immediately before the strength of the gradient magnetic field is increased or decreased, the variable resistor shows a high resistance value so as to quickly attenuate an induced current, while immediately before an AC magnetic flux signal to be detected is applied to the flux meter, the variable resistor shows a low resistance so as not to generate any thermal noise.

BRIEF DESCRIPTION OF THE DRAWINGS

FIGS. 4A to 4D show a time chart of operation for detection of an NMR signal by the detecting circuit including the variable resistor shown in FIG. 2.

DESCRIPTION OF THE PREFERRED EMBODIMENTS

Preferred embodiments of the present invention will now be described in detail with reference to the drawings.

Figure 1:
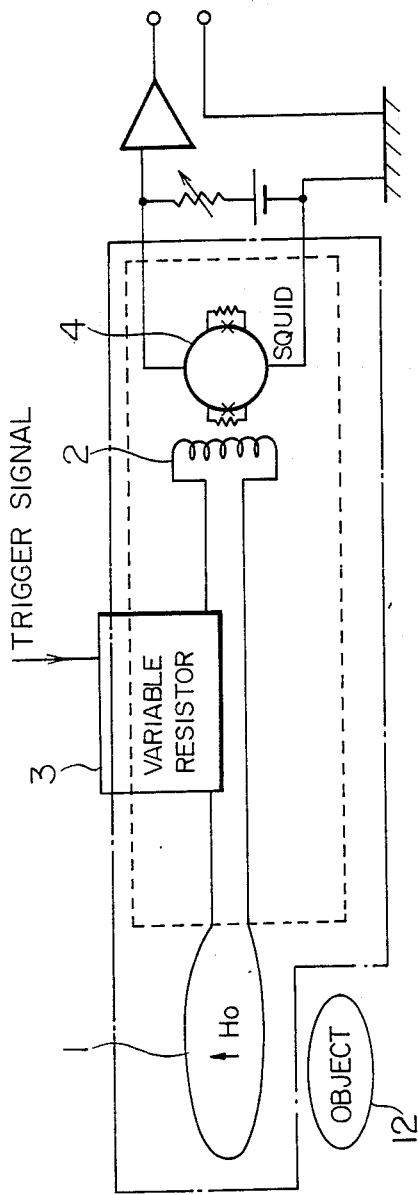
FIG. 1 shows the structure of an embodiment of the NMR signal detecting circuit of the present invention using a SQUID type flux meter for detection of an NMR signal.

FIG. 1 shows the structure of an embodiment of the NMR signal detecting circuit of the present invention using a SQUID type flux meter for detecting an NMR signal in an NMR imaging apparatus. Referring to FIG. 1, a receiving coil 1 receiving an NMR signal from an object 12 to be inspected, an input coil 2 applying the received NMR signal as an input to a SQUID type flux meter 4, and a variable resistor 3 are combined to constitute a closed loop through which the NMR signal is received and transmitted to the SQUID type flux meter 4. The SQUID type flux meter 4 is magnetically coupled to the input coil 2.

The parts of the NMR signal transmission loop, except the variable resistor 3, are made of a superconducting material. Therefore, the parts including the SQUID type flux meter 4 are surrounded by the one-dot chain lines to show that they are immersed in a pool of liquid helium.

Further, in order to minimize external noise, the NMR signal transmission loop and the SQUID type flux meter 4, except the receiving coil 1, are surrounded by the broken lines to show that they are magnetically shielded. Depending on the type of the variable resistor 3, a trigger signal is applied to the variable resistor 3 when so required, as described later.

Figure 2:
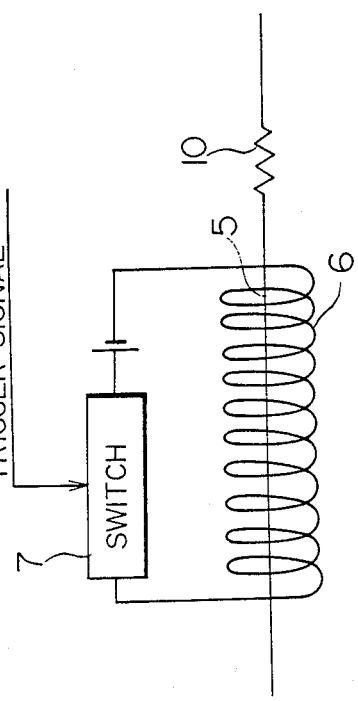
FIG. 2 shows the practical structure of one form of the variable resistor shown in FIG. 1.

FIG. 2 shows the practical structure of one form of the variable resistor 3. Referring to FIG. 2, a superconducting wire 5 acting as the variable resistor operates in a normal conducting state when the strength of a magnetic field applied thereto is larger than a critical value, but it operates in a superconducting state when the magnetic field strength is smaller than the critical value. An actuating coil 6 applies the magnetic field to the superconducting wire 5, so that the superconducting wire 5 shows its high resistance. A switch 7 supplies current to the actuating coil 6, so that the coil 6 applies the magnetic field to the superconducting wire 5 when the switch 7 is turned on. A fixed resistor 10 having a very small resistance value is connected in series with the superconducting wire 5. The material of the superconducting wire 5 is such as placed in its superconducting state at a critical magnetic field smaller than that of the receiving coil 1, as described later.

When the switch 7 is in its off position, the resistance value of the circuit is equal to that of the fixed resistor 10 and is very small. On the other hand, when the switch 7 is turned on to supply current to the actuating coil 6 thereby applying, to the superconducting wire 5, a magnetic field having a strength larger than the critical value, the superconducting wire 6 is released from its superconducting state and shows its high resistance. In this manner, the resistance value of the circuit shown in FIG. 2 can be increased and decreased by turning on and off the switch 7.

Figure 3:
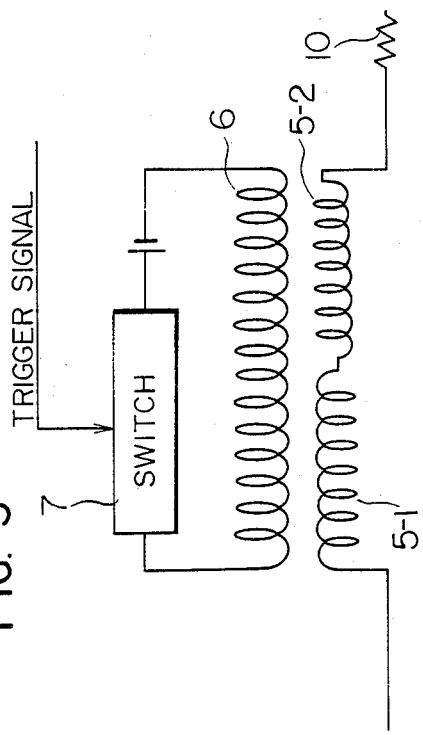
FIG. 3 shows the detailed structure of FIG. 2.

The superconducting wire 5 acting as the variable resistor 3 is preferably in the form of a coil as shown in FIG. 3, so that its resistance value in its normal conducting state can be increased. In this case, in order to minimize the inductance value of the wire 5, two coils 5-1 and 5-2 wound in respectively opposite directions are preferably connected to each other as shown in FIG. 3.

The operation of the first embodiment will now be described with reference to FIGS. 4A to 4D which show a time sequence of detection of the NMR signal by the circuit shown in FIGS. 1 and 2. FIG. 4A shows the strength of the DC magnetic field applied to the receiving coil 1, FIG. 4B shows the resistance value of the variable resistor 3, FIG. 4C shows the waveform of the NMR signal, and FIG. 4D shows the waveform of the current flowing in the magnetic flux signal transmission path. In each of FIGS. 4A to 4D, the horizontal axis represents time. In a period S after time $t_c$ but slightly before time $t_d$ in FIG. 4D, the NMR signal from the object 12 is detected. Between the time $t_c$ and the time $t_d$, the strength of the DC magnetic field applied to the receiving coil 1 is larger than its normal value $H_0$. This is because the strength of the magnetic field within the field of vision of the NMR imaging apparatus is to be inclined in a predetermined direction in this period so as to attain accurate analysis of the position the NMR signal. That is, in the period of from time $t_c$ to time $t_d$, a magnetic field having an intensity gradient along the predetermined direction is applied in addition to the DC magnetic field having the uniform strength $H_0$, as shown in FIG. 4A. Another gradient magnetic field is also applied in a period from time $t_a$ to time $t_b$ in FIG. 4A prior to the period in which the gradient magnetic field is applied in a relation overlapping the period S of NMR signal detection. Although FIG. 4A shows that this gradient magnetic field is applied only once in the period from time $t_a$ to time $t_b$ before the period S of NMR signal detection, such a magnetic field may be applied a plurality of times in the practical NMR imaging apparatus. This gradient magnetic field applied prior to the period S of NMR signal detection is classified into a plurality of types according to their service, as follows:

(1.) The gradient magnetic field is applied together with a high-frequency magnetic field pulse signal in order to limit the volume of the NMR signal. For details, see U.S. Pat. No. 4,021,726 which is incorporated by reference.

(2.) The gradient magnetic field having a programmable strength is applied so that the information of the phase and position of the NMR signal can be encoded along a direction different from the direction of inclination of the gradient magnetic field applied in the period of from time $t_c$ to time $t_d$ in FIG. 4A. For details, see U.S. Pat. No. 4,506,222 which is incorporated by reference.

(3.) The gradient magnetic field for previously dephasing the NMR signal is applied so as to adjust the time where the NMR signal attains its peak value. For details, see U.S. Pat. No. 4,471,306 which is incorporated by reference.

Anyway, in the NMR imaging apparatus intended for imaging, on-off of the gradient magnetic field is repeated a plurality of times, with the result that the strength of the DC magnetic field applied to the receiving coil 1 changes sharply as shown at times $t_a$, $t_b$, $t_c$ and $t_d$ in FIG. 4A. Therefore, the variable resistor 3 shows its low resistance only during a period $T_1$ having sufficient time margins before and after the period S of NMR signal measurement. That is, the arrangement is such that the variable resistor has its high resistance value R at at least the times $t_a$, $t_b$, $t_c$ and $t_d$ where the strength of the DC magnetic field interlinking the receiving coil 1 increases and decreases. As a result, the current flowing in the magnetic flux signal transmission path attenuates quickly according to the time constant L/R. On the other hand, during the period S of NMR signal measurement, the variable resistor 3 has its low resistance value r thereby minimizing thermal noise. Therefore, direct current due to the DC magnetic field is not superposed on the signal current, and thermal noise due to the high resistance is not superposed on the signal current, so that the NMR signal can be detected with a high S/N ratio.

The effect of improving the S/N ratio is higher when the low resistance value r of the variable resistor 3 is smaller, and, in the superconducting state, the value of r is zero. However, because of the flow of shield current due to the DC magnetic field as described above, the low resistance value r of the variable resistor 3 should not be zero.

It will thus be seen that a useful NMR signal detecting circuit can be provided in which current generated due to the DC magnetic field does not give rise to degradation of the accuracy of NMR signal detection, and any substantial thermal noise is not generated during the period of NMR signal detection.

In the prior art NMR apparatus using the LC circuit, the series loss $r_0$ is given by $$r_0 = \frac{1}{Q_c\omega C},$$

where C is the capacity of the capacitor, $Q_c$ is the selectivity of the capacitor and $\omega$ is the angular frequency.

A thermal noise voltage $V_n$ attributable to the resistance R is given by $$V_n = \sqrt{4kTRB},$$

where k is the Boltzmann's constant, T is the temperature and B is the bandwidth of the NMR signal. Both the induced voltage $V_{in}$ induced from the magnetic flux of the NMR signal and the thermal noise voltage $V_n$ attributable to the series loss $r_0$ are amplified by the same factor, and such amplified voltages appear in the output. Therefore, the S/N ratio $(S/N)_0$ in the output of the prior art circuit is given by $$(S/N)_0 = V_{in}/\sqrt{4kTr_0B}$$

On the other hand, the S/N ratio $(S/N)_n$ in the output of the circuit of the present invention is given by $$(S/N)_n = V_{in}/\sqrt{4kTrB}$$

where r is the low resistance value of the variable resistor 3. Therefore, the present invention improves the S/N ratio as follows:

$$\frac{(S/N)_n}{(S/N)_0} = \sqrt{\frac{r_0}{r}} = \sqrt{\frac{1}{Q_c\omega Cr}}$$

In the case of the aforementioned prior art example, $r_0=0.2\Omega$ when $\omega=200\times10^{-6}$ rad/sec. Thus, when the value of r in the present invention is selected to be about $r=0.2\times10^{-6}\Omega$ the S/N ratio can be improved by about three orders of magnitude. The resistance value described above is sufficiently small as compared to the sum of the inductance values of the receiving coil and input coil, and the time constant $\tau=L/r$ is sufficiently long as compared to the period of signal detection, so that the signal current is not attenuated. Since the value of r can be selected to be further smaller than that described above, the rate of improving the S/N ratio can be further increased. Further, when the NMR signal is detected at a lower signal frequency, the S/N ratio can be more markedly improved in spite of a decrease in the amount of the signal.

The advantage of the present invention is similar to that described above even when a heater replaces the actuating coil 6 shown in FIG. 2 and is used for heating the superconducting wire 5 to a level higher than the superconduction transition temperature of the superconducting wire 5. In this case, measurement of the NMR signal is facilitated when the superconducting wire 5 operating as the variable resistor 3 is made of a material having a lowest transition temperature as compared to those of the other parts. In this case too, it is apparent that the superconducting wire 5 is preferably in the form in which two coils wound in respectively opposite directions are connected to each other as shown in FIG. 3.

Figure 6:
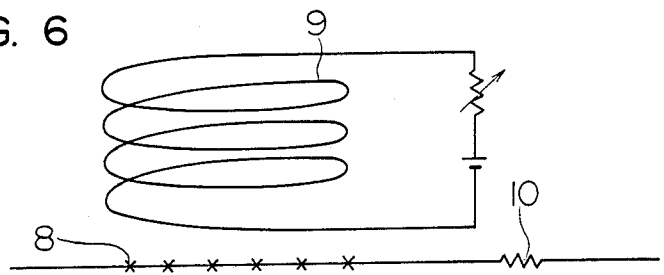
FIG. 6 shows another embodiment of the present invention in which a superconducting wire having a plurality of Josephson junctions is used as the variable resistor.
Figure 7:
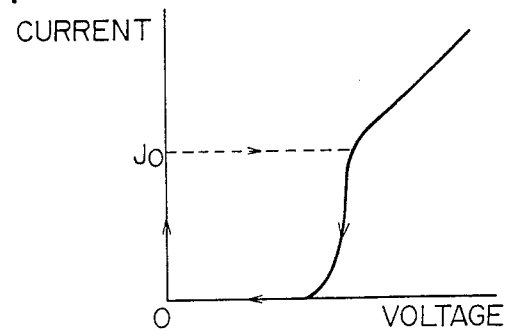
FIG. 7 is a graph showing the voltage-current characteristic of the superconducting wire having the plural Josephson junctions.

In a modification of the first embodiment, the variable resistor 3 is in the form of a superconducting wire having a plurality of Josephson junctions 8 therein as shown in FIG. 6, and a magnetic field having a freely selected fixed strength is applied to the superconducting wire from an associated coil 9. It is known that such a superconducting wire having a plurality of Josephson junctions has a current-voltage characteristic as shown in FIG. 7. It will be seen in FIG. 7 that the superconducting wire acts as a superconductor until the value of current increasing from zero attains a definite level $J_0$ but acts as a resistor when the current value exceeds the above level $J_0$. In contrast, when the current value exceeding the above level $J_0$ is decreased, the superconducting wire remains acting as the resistor until the current value becomes nearly equal to zero.

The current value corresponding to the level $J_0$ is called a critical current. The value of this critical current decreases in inverse proportion to the strength of the magnetic field applied to the Josephson junctions. Now, a suitable current is supplied to the coil 9, and the value of the critical current is selected to be intermediate between the value of current induced by the inclined magnetic field and the maximum value of the signal current. In such a case, the Josephson junctions become resistive when the current induced by the inclined magnetic field flows, and the superconducting wire restores its superconducting state when the current is attenuated to zero due to the resistance.

Figure 5:
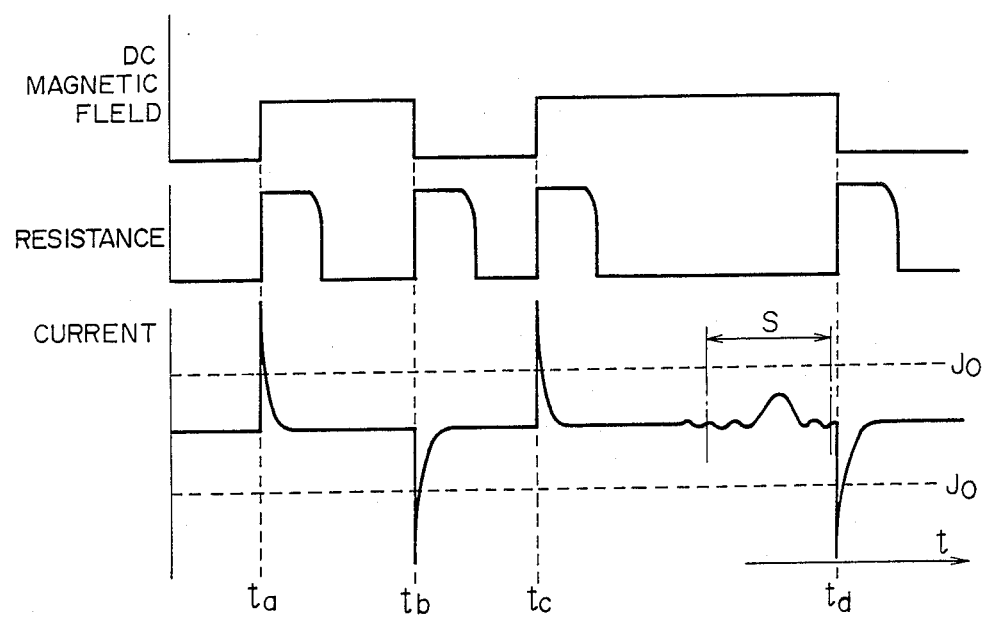
FIG. 5 shows a time chart of operation for detection of an NMR signal by the detecting circuit including another form of the variable resistor shown in FIG. 6.

In the form of the variable resistor shown in FIG. 6, a plurality of Josephson junctions are provided in series in the superconducting wire. This is because the resistance value of one Josephson junction is low, and plural Josephson junctions are required to increase the total resistance value obtained when all the Josephson junctions become resistive. The Josephson junctions are to be provided in a number sufficient to obtain the required resistance value. In addition to the advantage exhibited by the first embodiment, this second embodiment is advantageous in that any external control of the variable resistor is unnecessary. The time sequence of the operation of the second embodiment is shown in FIG. 5 in which the horizontal axis represents time, while the vertical axes represent the strength of a DC magnetic field interlinking the receiving coil, the resistance value of the automatic variable resistor, and the waveform of current flowing in the magnetic flux signal transmission path.

The aforementioned embodiments have referred to the use of a flux meter of DC-SQUID type for magnetic flux measurement. It is apparent, however, that the present invention is in no way limited to the use of such a specific flux meter, and a flux meter of RF-SQUID type or that of different type may also be used to attain the effect similar to that described above.

We claim:

1. A circuit for detecting, during a signal detection period, an AC magnetic field due to magnetic resonance in an object which lies in a DC magnetic field wherein the strength of said DC magnetic field changes in periods other than said signal detection period, said circuit comprising:
   a superconducting receiving coil disposed such that the magnetic flux of said AC magnetic field is superimposed on the magnetic flux of said DC magnetic field and penetrate said superconducting receiving coil;
   a superconducting flux meter having a superconducting input coil;
   a variable resistor, the resistance value thereof being controlled to a lower value during said signal detection period and controlled to a higher value when said DC magnetic field is changed; and
   superconducting connection means for connecting said receiving coil, said input coil and said variable resistor so that a superconducting closed loop into which said variable resistor is inserted is formed and that a signal indicative of magnetic flux penetrating through said receiving coil and is applied to said input coil;

2. A detecting circuit according to claim 1, wherein the resistance value of said variable resistor is maintained at said higher value in periods other than said signal detection period.

3. A detecting circuit according to claim 1, wherein a Josephson junction is used to provide said variable resistor.

4. A detecting circuit according to claim 1, wherein said variable resistor is provided by a wire of a superconducting material, and the temperature of said superconducting wire is changed to cause transition between a superconducting state and a normal conducting state.

5. A detecting circuit according to claim 4, wherein the material of said superconducting wire providing said variable resistor has a superconduction-normal conduction transition temperature lower than that of a superconducting material constituting the other parts of said superconducting loop.

6. A detecting circuit according to claim 1, wherein said variable resistor is provided by a wire of a superconducting material, and the strength of a magnetic field applied to said superconducting wire is changed to cause transition between a superconducting state and a normal conducting state.

7. A detecting circuit according to claim 6, wherein the material of said superconducting wire providing said variable resistor is placed in the superconducting state at a critical value of the magnetic field strength lower than that of a superconducting material constituting the other parts of said superconducting loop.

8. A detecting circuit according to claim 4, wherein said superconducting wire providing said variable resistor is formed by connecting two coils wound in respectively opposite directions.

9. A detecting circuit according to claim 6, wherein said superconducting wire providing said variable resistor is formed by connecting two coils wound in respectively opposite directions.

10. A circuit for detecting, during a signal detecting period, an AC magnetic field due to the magnetic resonance of an object which lies in a DC magnetic field wherein the strength of said DC magnetic field changes in periods other than said signal detection period, said circuit comprising:
    a superconducting receiving coil disposed such that the magnetic flux of said AC magnetic field is superimposed on the magnetic flux of said DC magnetic field and penetrates said superconducting receiving coil;
    a superconducting flux meter having a superconducting input coil;
    noise suppressing means for suppressing noise generated due to said DC magnetic field; and
    superconducting connection means for connecting said receiving coil, said input coil and said noise suppressing means so that a superconducting closed loop is formed and that a signal indicative of magnetic flux penetrating through receiving coil is applied to said input coil.

11. A circuit for detecting according to claim 10, wherein said noise suppressing means is a variable resistor controlled so that the resistance value of said variable resistor is set to a lower value during said signal detection period and to a higher value when said DC magnetic field is changed.

12. A detecting circuit according to claim 11, wherein a Josephson junction is used to provide said variable resistor.

13. A detecting circuit according to claim 11, wherein said variable resistor is provided by a wire of a superconducting material, and the temperature of said superconducting wire is changed to cause transition between a superconducting state and a normal conducting state.

14. A detecting circuit to claim 13, wherein the material of said superconducting wire providing said variable resistor has a superconduction-normal conduction transition temperature lower than that of a superconducting material constituting the other parts of said superconducting loop.

15. A detecting circuit according to claim 11, wherein said variable resistor is provided by a wire of a superconducting material, and the strength of a magnetic field applied to said superconducting wire is changed to cause transition between a superconducting state and a normal conducting state.

16. A detecting circuit according to claim 15, wherein the material of said superconducting wire providing said variable resistor is placed in the superconducting state at a critical value of the magnetic field strength lower than that of a superconducting material constituting the other part of said superconducting loop.

17. A detecting circuit according to claim 13, wherein said superconducting wire providing said variable resistor is formed by connecting two coils wound in respectively opposite direction.

18. A detecting circuit according to claim 15, wherein said superconducting wire providing said variable resistor is formed by connecting two coils in respectively opposite directions.

* * * * *